United States Patent [19]

Tarng

[11] Patent Number: 5,198,691
[45] Date of Patent: Mar. 30, 1993

[54] BIMOS DEVICES AND BIMOS MEMORIES

[76] Inventor: Min M. Tarng, 1367 Glenmoor Way, San Jose, Calif. 95129

[21] Appl. No.: 577,792

[22] Filed: Sep. 5, 1990

Related U.S. Application Data

[63] Continuation-in-part of Ser. No. 335,584, Apr. 10, 1989, abandoned.

[51] Int. Cl.$^5$ .................................... H01L 27/04
[52] U.S. Cl. ..................... 257/316; 257/370; 257/378; 257/318
[58] Field of Search .............. 357/43, 35, 23.5, 42

[56] References Cited

U.S. PATENT DOCUMENTS 4,825,274  4/1989  Higuchi et al. ............... 307/446

Primary Examiner—William D. Larkins

[57] ABSTRACT

The BiMOS devices are compact 3D devices having a coupled bipolar and MOS mechanisms integrated in one single cell. The gates cover over the bipolar regions. The bipolar regions are the tubs of the MOS mechanisms. The MOS mechanisms make the connection between the base, emitter and collector to charge and discharge the base voltage. The input applies on the gate to switch on/off the base current of the bipolar mechanism. There are P-PNP, N-NPN, N-PNP, P-NPN, PN-PNP, PN-NPN, NP-PNP and NP-NPN BiMOS devices. The BiMOS inverter, NOR, NAND logic gates are the single stage circuit having the same circuit configuration as CMOS circuits. They are made of P-PNP, N-NPN, NP-PNP and NP-NPN BiMOS devices. The digital BiMOS buffer, OR, AND logic gates are the single stage circuits made of N-PNP, P-NPN, PN-PNP and PN-NPN BiMOS devices. Furthermore, the BiMOS technologies are applied to SRAM, EPROM and EEPROM to generate the BiMOS SRAM, BiMOS EPROM and BiMOS EEPROM memory devices.

13 Claims, 10 Drawing Sheets

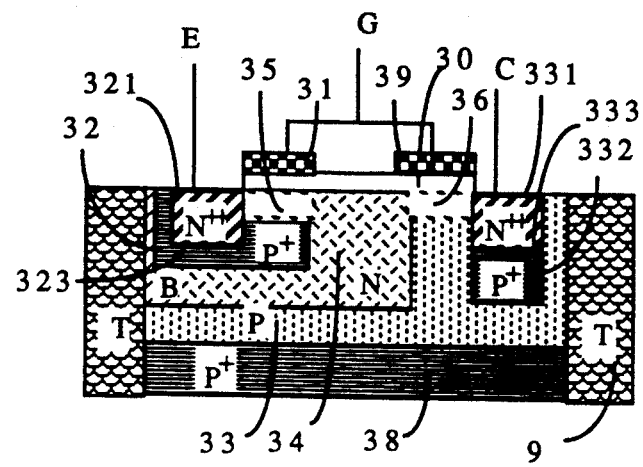
FIG.3A
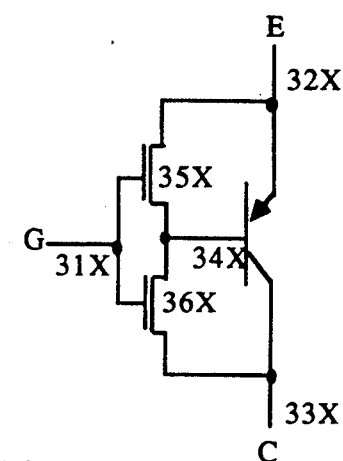
FIG.3B
FIG.3C
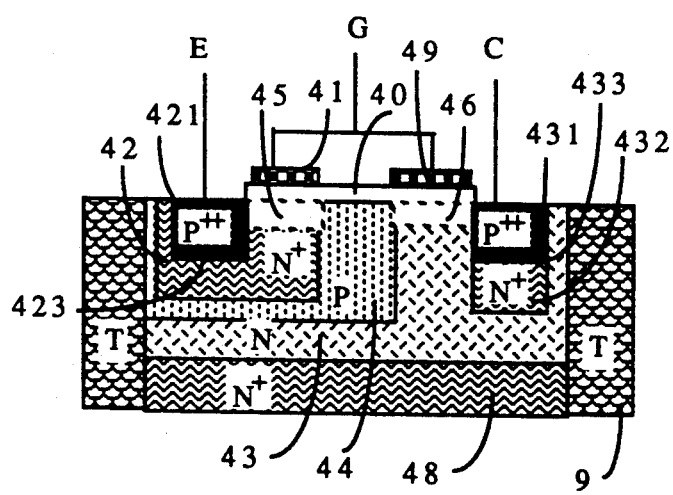
FIG.4A
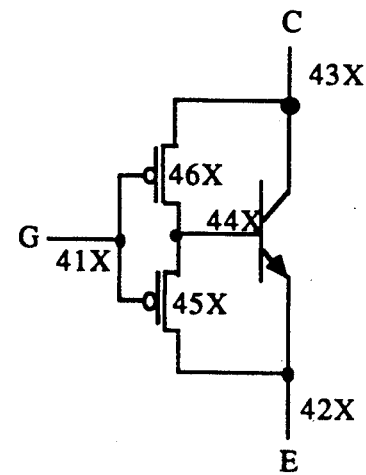
FIG.4B
FIG.4C U.S. Patent    Mar. 30, 1993    Sheet 3 of 10    5,198,691

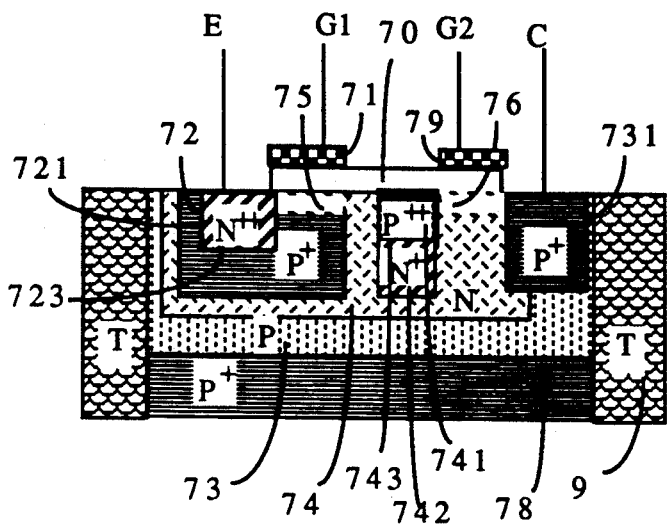
FIG.7A
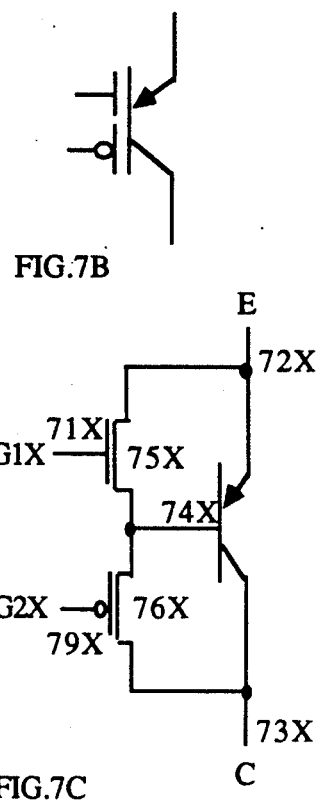
FIG.7B
FIG.7C
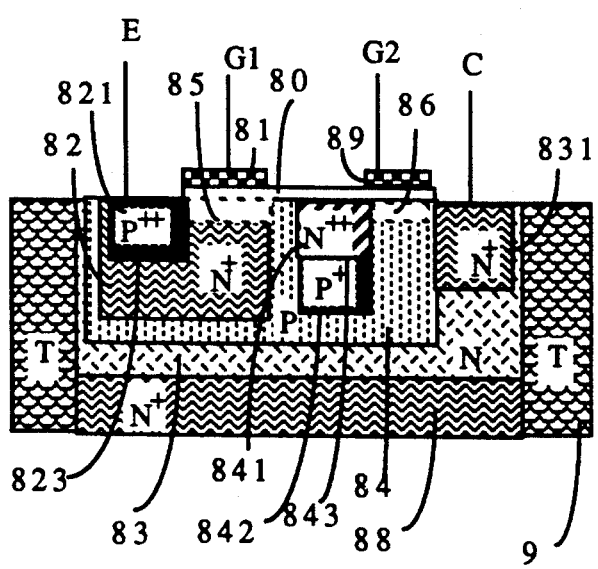
FIG.8A
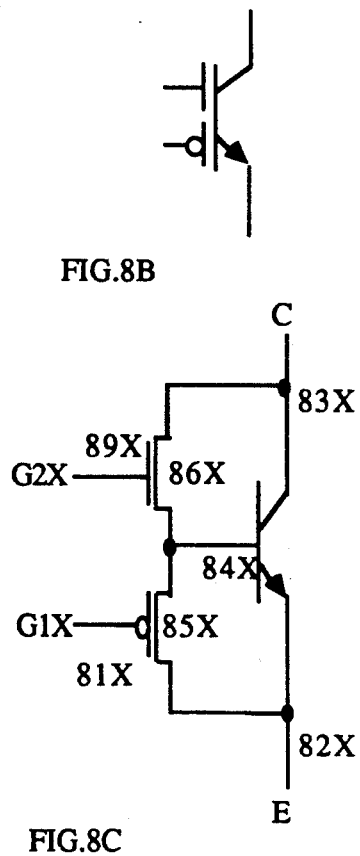
FIG.8B
FIG.8C

BIMOS DEVICES AND BIMOS MEMORIES

This is a continuation in part of application Ser. No. 07/335,584 filed Apr. 10, 1989, now abandoned.

BACKGROUND—FIELD OF INVENTION

This invention relates to BiMOS, BiFET, BiMOS SRAM and BiMOS EEPROM devices, specifically to such BiMOS and BiFET devices which have both charging and discharging MOS and FET means integrated with the controlled bipolar means in one single cell.

BACKGROUND—DESCRIPTION OF PRIOR ART

The most popular devices used in the industry are the bipolar and CMOS devices. Comparing their characteristics, one's advantages are the other's disadvantages and vice versa. The characteristics of CMOS such as minimum power consumption and heat dissipation, rack-to-rack voltage swing, simple circuit configuration and simple device structure make the CMOS as the main technology in VLSI design. However, as the chip becomes larger and larger, the capacitive load becomes too big for the CMOS to drive. It was considered to integrate the bipolar device with CMOS devices.

My BiMOS invention is a new device having a single stage only. It is a single device. Both charging and discharging FET or MOS means are integrated in one unit cell with the bipolar means. The field effect of MOS has the direct field effect on the bipolar that the MOS and bipolar is integrated to be one new device. My BiMOS device is a true BiMOS device: the single stage having the gain of cascade amplifiers integrated in one unit cell. It has the high gain, high speed, high power and high driving capability. The charging MOS means and the discharging MOS means are integrated with the bipolar means in one single cell. The field effect applies to the bipolar regions directly. My BiMOS device is single stage device so that my BiMOS circuit speed is much faster and the layout area is much more compact. My BiMOS device doesn't have the N-P-N-P structure so that the latch-up doesn't occur. Since my BiMOS device is single cell device, I can invent the BiMOS EPROM and BiMOS EEPROM based on my BiMOS device. With the BiMOS device being basic mechanism of the nonvolatile memory device, I further invent the BiMOS EPROM, BiMOS EEPROM, etc. To illustrate the novelty of new BiMOS device, I invent the BiMOS logic gates, buffers and BiMOS SRAM. None of the references has the superior features.

In hitherto known Bi-CMOS semiconductor device, attempts have been made to decrease the device area by merging a bipolar transistor with a MOSFET. In such a structure, the base of the bipolar transistor is used commonly as the drain of the MOSFET, as disclosed, for example, in U.S. Pat. No. 4,825,274. U. Higuchi and M. Suzuki proposed a device having a latched up structure, the N-P-N-P latching up structure. Despite their efforts, there is no way to guarantee the latch-up not to occur. They used the traditional MOS and bipolar devices. The substrate is biased to ground isolating the field effect from the bipolar. The field of MOS means has no direct effect on the bipolar means. The source of MOS and the emitter of bipolar transistor are individual components. It needs to use the metal connection to connect the emitter and source. Furthermore, the discharging MOS device is not integrated in the same cell.

In the U.S. Pat. No. 4,829,200, J. F. Downey proposed a logic circuit utilizing a composite device having the bipolar transistor and the MOSFET device connected in parallel serving as the NOR or NAND gates. In his composite device, the input of bipolar transistor connects to base; the input of MOS device connects to gate. The bipolar and MOS devices work independent of each other. There is the N-P-N-P latch-up structure. His composite device doesn't have the BiMOS device effect: the MOS controlling the base current of bipolar to drive the large load. So, his device is not a BiMOS device.

In the U.S. Pat. No. 4,829,201, I. Masuda, et. al. proposed the gate circuit having the field-effect devices and bipolar transistors. All those MOS devices and bipolar transistors are individual components. It wastes the layout area. The field effect doesn't apply to the bipolar region directly. Their circuit has two stages, CMOS stage and bipolar stage, that the circuit speed slows down.

In the U.S. Pat. No. 4,618,872, B. J. Baliga proposed to short one p-n junction of the p-n-p-n in IGT device to be MOSFET device. His IGT device is not bipolar device; his MOSFET device is in vertical direction and has to be connected in parallel with IGT device. So his device is IGT connected in parallel with MOS. It doesn't have the effect of MOS controlling the bipolar. So, his device is not a BiMOS device.

As claimed in the U.S. Pat. No. 4,879,480 by Y. Suzuki, et al., the logic circuit uses the TTL output buffer having the voltage swing from zero to 2.8 volts. My BiMOS circuit does not need to use the bipolar TTL circuits as the output. It has the high input impedance and high speed, high current driving capability. My BiMOS logic gates have the rack to rack voltage swing, from zero to 5 volts. Furthermore, their TTL buffer is very complex because of multiple stages. My buffer circuit is very simple. It has single stage only. Comparing with my BiMOS buffer, their circuit speed is much slower.

But nevertheless all the BiMOS circuits and devices heretofore known suffer from a number of disadvantages that the BiMOS technology still cannot commercialize.

(a) On the same chip, the CMOS device and bipolar device are the individual components.

(b) In the circuit design, there are at least two-stages, CMOS-Bipolar circuit.

(c) For a light load, the two-stage CMOS-Bipolar circuit speed is even slower than single-stage CMOS circuit.

(d) The chip area for BiMOS circuit are much larger than CMOS circuit.

(e) The CMOS-Bipolar process is much complex. It needs to fabricate both the CMOS device and the bipolar device on the same chip. There are much more process steps.

(f) The CMOS-Bipolar chip yield is much lower and the cost is much higher.

(g) There is no nonvolatile BiMOS memory to drive the long data line. The access time is pretty long.

OBJECTS AND ADVANTAGES

My invention is the first true BiMOS and BiFET device. In a single cell, the distributed field effect of MOS or FET means controls the Bipolar means directly. So the new device is called as a BiMOS or BiFET device. There are eight different BiMOS or BiFET devices: P-PNP, N-NPN, N-PNP, P-NPN, PN-PNP, PN-NPN, NP-PNP and NP-NPN devices. Furthermore, the BiMOS EPROM, BiMOS EEPROM and BiMOS SRAM memory cells are invented based on the new BiMOS device technology.

The BiMOS device is a single stage circuit having the gain of two-stage cascade amplifiers. As the gate is switched on, the inversion layer and depletion layer are generated. It induces the base current immediately even before the starting of the flow of base current. Later, the base current starts to flow and the collector current flows according to the current amplification factor of bipolar device effect. The BiMOS device has much faster speed than the bipolar device. As the base voltage rises up close to the emitter voltage in one forward voltage of diode, the bipolar device will turn off. The MOS continues charging or discharging the load until the collector voltage equals to the emitter voltage. With the MOS effect, the BiMOS may have the full voltage swing, from rack to rack. It had the more current driving capability than the bipolar device. So the BiMOS drives larger load with larger voltage swing than bipolar does. However, the BiMOS device has the minimum power consumption as CMOS device has. Accordingly, besides the objects and advantages of the BiMOS devices and circuits described as above, several objects and advantages of the present invention are:

(a) It is just a single device having the compact device structure.

(b) The layout area is small.

(c) The BiMOS circuit is as simple as CMOS circuit.

(d) The driving capability is as powerful as and even better than the bipolar device.

(e) The BiMOS circuit speed is faster than the bipolar and CMOS circuit.

(f) The gain is larger than bipolar and CMOS device.

(g) The voltage range is the same as CMOS having the rack-to-rack voltage swing.

(h) The upgrade of existed CMOS circuit design with BiMOS devices is very simple. There is no need to redesign new circuits for the BiMOS devices. The circuits are modified by the replacements of PMOS with P-PNP BIMOS and NMOS with N-NPN BIMOS.

(i) The single stage Buffer, AND, OR logic gates are only available with the BiMOS device. The devices used in these circuits are N-PNP, P-NPN, PN-PNP and PN-NPN BiMOS devices. None of the references has this feature.

(j) There are push-pull high speed with limited swing BiMOS devices to increase the circuit speed. The devices used in these circuits are PN-PNP, PN-NPN, NP-PNP and NP-NPN BiMOS devices.

(k) The BiMOS devices give the designers much more design capability. Furthermore, my BiMOS device can reduce to be the CMOS and bipolar devices easily. On the same chip, the designer has three different devices, BiMOS, CMOS and bipolar, for him to use in design without the cost of yeild and process.

(l) The BiMOS device is immune to latch-up and high voltage. It overcomes the bottleneck of ULSI technology.

Further objects and advantages are to make breakthroghs in device for the ULSI (ultra large scale integration) design. Still further objects and advantages will become apparent from a consideration of the ensuing description and drawings.

DRAWING FIGURES

FIG. 3 (A) is the cross section of the N-PNP BiMOS device; (B) is the symbol for the N-PNP BiMOS device; (C) is the equivalent circuit for the N-PNP BiMOS circuit.

FIG. 4 (A) is the cross section for the P-NPN BiMOS device; (B) is the symbol for the P-NPN BiMOS circuit; (C) is the equivalent circuit for the P-NPN BiMOS circuit.

FIG. 7 (A) is the cross section of the NP-PNP BiMOS device; (B) is the symbol for the NP-PNP BiMOS device; (C) is the equivalent circuit for the NP-PNP BiMOS circuit.

FIG. 8 (A) is the cross section for the NP-NPN BiMOS device; (B) is the symbol for the NP-NPN BiMOS circuit; (C) is the equivalent circuit for the NP-NPN BiMOS circuit.

is the conducting well made of double diffusion in the N well.

FIG. 18 is the conducting wells made of the double diffusion having the tunneling effect; (A) is the conducting well made of the double diffusion in the P+ tub; (B) is the conducting well made of double diffusion in the N+ tub.

Figure 19:
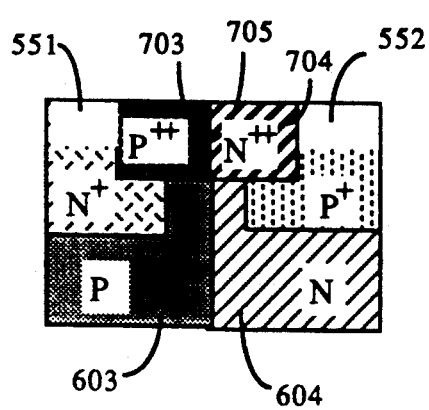

FIG. 19 is the conducting well made of the double diffusion having the tunneling effect for the channels, low doped substrate and highly doped well; the conducting well made of the double diffusion of N++ in the P+ tub and N substrate; the double diffusion of P++ in the N+ tub and P substrate.

Figure 20:
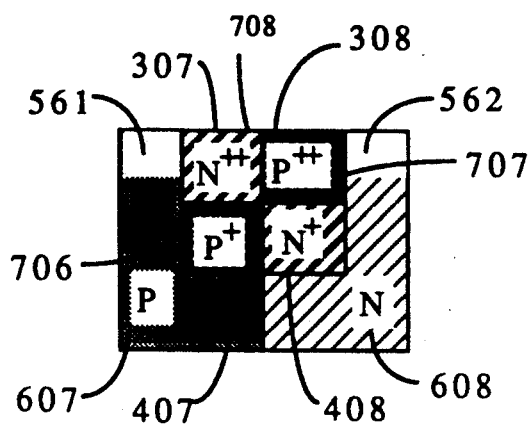

FIG. 20 is the conducting well made of the double diffusion having the tunneling effect for the P channel, N channel, P substrate and N substrate.

DESCRIPTION OF THE PREFERRED EMBODIMENTS

Figure 1A:
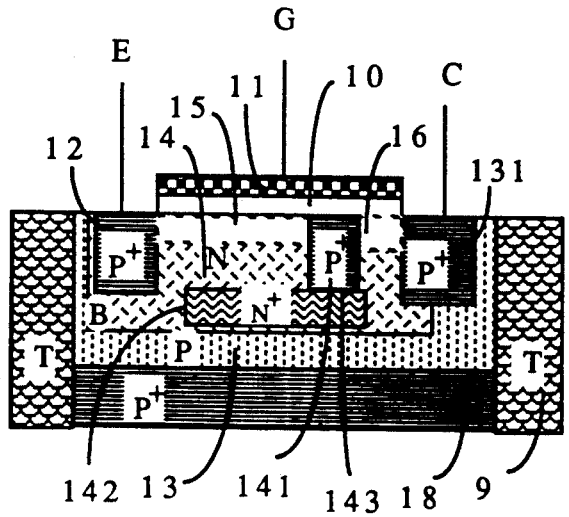
FIG. 1 (A) is the cross section of the P-PNP BiMOS device; (B) is the symbol for the P-PNP BiMOS device; (C) is the equivalent circuit for the P-PNP BiMOS circuit.

Referring to FIG. 1A, in the P-PNP BiMOS device, the gate 11 covers on the base 14 between the emitter 12 and collector 13. The isolation 10 separates the gate 11 from the base 14. To enhance the performance, there may have N+ buried layer 142 to reduce the resistance of base. Between the emitter 12 and collector 13, there is one conducting well made of the P++ diffusion 141 and N+ layer 142. The depth of conducting well P++ diffusion region 141 penetrates through the depletion region into the active base region 14. In the N base 14, the conducting well is made of the P++ region 141 and N+ region 142 having the tunnelling effect at ohmic connection 143. Since both the P++ region 141 and N+ buried layer 142 are heavily doped, the junction as their interface 143 is essentially a tunneling junction across which conduction readily occurs by means of a tunneling mechanism as is well known in the art. The connection is, therefore, essentially ohmic. The collector region 131 is made of P material; the buried layer 18 is made of P+ material. The trench isolation 9 is to isolate this device from the other devices.

As the gate 11 switches to low state, the P channels 15 and 16 start to form. In the formation of depletion layer and inversion layer, the electrons are expelled toward the bottom of base. The expelled electrons form the internal base current. Even before the base current is drained out of the base 14, this internal base current induces the collector current. The field effect induced base current causes the speed of P-PNP BiMOS device to be faster than the bipolar device. After the channel regions 15 and 16 are formed, the base current is drained out of the base 14. It induces the collector current flowing through the collector region 131, the buried layer 18 to collector 13. The voltage of collector 13 increases under the charging of bipolar and MOS mechanism. The voltage of the base 14 increases, too. As the base voltage is within one forward diode voltage drop from the voltage of emitter 12, the bipolar mechanism of P-PNP BiMOS is turned off. The channels 15 and 16 of MOS mechanism still stay on. The current flows through the channels 15 and 16 from the emitter 12 to collector 13. The current charges the collector 13 until the voltage of collector 13 equals to the voltage of emitter 12. So the P-PNP BiMOS device has the rack-to-rack full swing of voltage range. As the voltage of gate 11 shifts to high level, the channels 15 and 16 disappear. There is no base current. The voltage of base 14 is within one forward bias diode voltage drop from the voltage of emitter 12. The bipolar mechanism is turned off. So the P-PNP BiMOS device is completely shut down and there is no static power consumption.

Figure 1B:
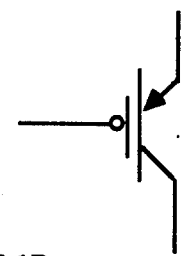

FIG. 1B is the symbol for the P-PNP BiMOS device as shown in FIG. 1A. It is the hybrid of PNP and PMOS symbols.

Figure 1C:
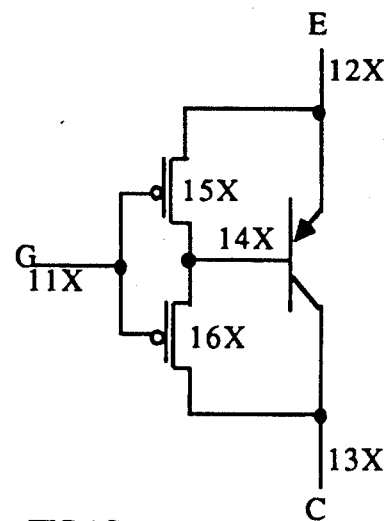

FIG. 1C is the equivalent circuit for the P-PNP BiMOS device as shown in FIG. 1A. All the numerals marked in FIG. 1C are corresponding to the numerals as shown in FIG. 1A with the addition of X. All the phenomena discussed as above can be explained with this equivalent circuit. Referring to FIG. 1C, as the gate 11X is switched low, there are charges injecting into the base 14X from PMOS 15X and PMOS 16X. This charge injection induces the collector current immediately. As MOS 16X turns on, the base current is drained out of the base 14X and enables the bipolar. As the voltage of collector 13X increases to have the voltage of base 14X to be within the voltage drop of one forward biased diode from the voltage of emitter 12X, the bipolar is turned off. The MOS 15X and MOS 16X still remain on. The current continues flowing through MOS 15X and MOS 16X to have the voltage of collector 13X equal to the voltage of emitter 12X.

Figure 2A:
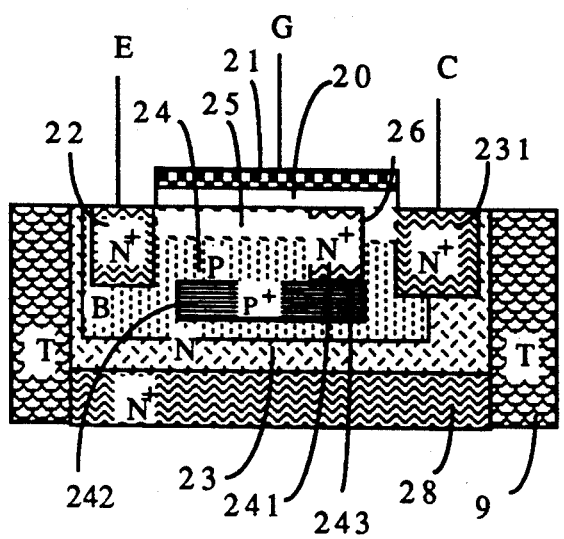
FIG. 2 (A) is the cross section for the N-NPN BiMOS device; (B) is the symbol for the N-NPN BiMOS circuit; (C) is the equivalent circuit for the N-NPN type BiMOS circuit.
Figure 2B:
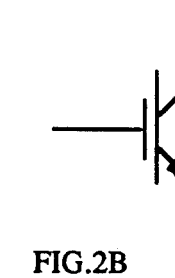
Figure 2C:
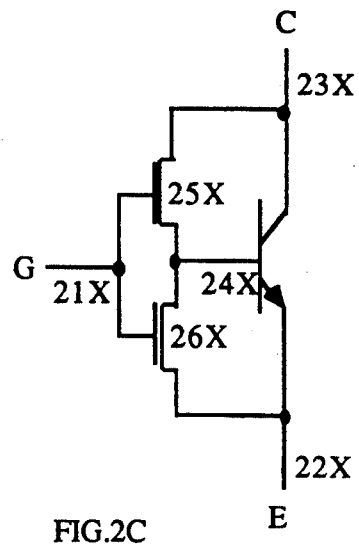

FIGS. 2A shows the N-NPN BiMOS device. The N-NPN BiMOS device is the complementary BiMOS(-CBiMOS) device of P-PNP BiMOS device. A discussion similar to P-PNP BiMOS may be applied to the N-NPN BiMOS. The P+ buried layer 242 serves to reduce the resistance of base 24. The conducting well is made of the N++ diffusion region 241, P+ region 242 and the tunneling junction 243. The tunneling junction 243 is ohmic. FIG. 2B is the symbol of N-NPN BiMOS device. FIG. 2C is the equivalent circuit of the N-NPN BiMOS device.

Referring to FIG. 3, in the N-PNP BiMOS device, the gates 31 covers on the emitter 32 region; the gates 39 covers on the collector region 37. The collector region 37 is made of P material; the buried layer 38 is made of P+ material. The isolation region 30 separates the gates 31 and 39 from the emitter 32 and collector 37. As the high state voltage applies to the gates 31 and 39, the channels 35 and 36 are formed in the emitter 32 and collector 33. In the collector region, the conducting well is made of the N++ diffusion region 331, the P+ diffusion region 332 and the tunneling junction 333. In the P+ emitter region 32, there is a highly doped N++ region serving as the conducting well. The tunneling junction 323 is ohmic. The trench isolation 9 isolates this device from the other devices.

As the gates 31 and 39 switch high, the N channels 35 and 36 start to form. The electrons flow from the conducting well 331 to the base 34, from the base 34 to the emitter 32. Before the channels are formed, the base voltage is within the voltage drop of one forward biased diode from the voltage of emitter 32. The voltage difference between gate 31 and collector 33 is much larger than the voltage difference between the gate 39 and base 34. The current flows from the base 34 to the collector 33 is much larger than the current flows from the emitter 32 to the base 34. The current difference between the above two currents is the base current drained out of the base 34. It induces the collect current flowing through the collector region, the buried layer 38 and collector 33. As the voltage of collector 33 increases, the voltage of the base 34 increases, too. As the voltage of base 34 is within the voltage drop of one forward bias diode from the voltage of emitter 32, the bipolar device is turned off. The electrons continues flowing from the collector 33 to emitter 32 through the channel 35, base 34 and channel 36. This electron flow makes the voltage of collector 33 equal to voltage of emitter 32.

As the voltage of gates 31 and 39 switch low, the channels 35 and 36 disappear. There is no base current. The bipolar mechanism is turned off. The N-PNP BiMOS device is completely shut down. There is no static power consumption.

FIG. 3B is the symbol for the N-PNP BiMOS device. It is the hybrid of the PNP and NMOS symbols. FIG. 3C is the equivalent circuit for the N-PNP BiMOS device. All the phenomena discussed as above can be explained with this equivalent circuit. The numerals marked in FIG. 3C are corresponding to the numerals in FIG. 3A with the addition of X. As the MOS 36X turns on, the base current flows out of the base 34X. It induces a large amount of collector current. The voltage of collector 33X increases. As the voltage of base 34X is within the voltage drop of one forward biased diode from the emitter 32X, the bipolar device is turned off. The MOS 35X and 36X still turn on. The electrons continue flowing through MOS 36X and 35X until the voltage of collector 33X is equal to the voltage of emitter 32X.

As shown in FIG. 4A, FIG. 4B and FIG. 4C, the P-NPN BiMOS device is the complementary BiMOS of N-PNP BiMOS device. In the collector region, the conducting well is made of the P++ diffusion 431, N+ diffusion region 432 and the tunneling junction 433. In the N+ emitter region 42, the conducting well is made of the highly doped P++ region 421 and the ohmic tunneling junction 423. The discussion for the P-NPN BiMOS device is similar to the discussion of N-PNP BiMOS device.

FIG. 5 is the PN-PNP BiMOS device; FIG. 6 is the PN-NPN BiMOS device; FIG. 7 is the NP-PNP BiMOS device; FIG. 8 is the NP-NPN BiMOS device. In these BiMOS devices, the base current is charged and discharged by the complementary MOS mechanisms. If the inputs of the complementary MOS mechanisms are connected together to be one single input, the push-pull effect of the complementary MOS mechanism makes the BiMOS devices having high speed response.

Figure 5B:
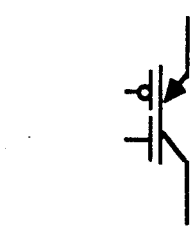
FIG. 5 (A) is the cross section of the PN-PNP BiMOS device; (B) is the symbol for the PN-PNP BiMOS device; (C) is the equivalent circuit for the PN-PNP BiMOS circuit.
Figure 5A:
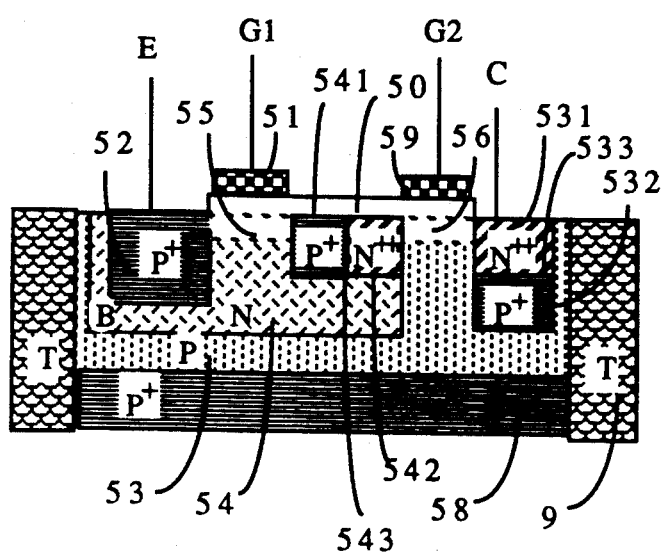

Referring to FIG. 5A, assuming gates 51 and 59 are in low state, the bipolar PNP is turned off. As the gates 51 and 59 switch high, the voltage of base 54 is pulled low. Under the discharge of NMOS 56, the base current is drained out of the base 54. The collector current charges up the load of collector 53. The voltages of collector 53 and base 54 increase. As the voltage of base 54 is within the voltage drop of one forward bias diode from the voltage of emitter 52, the bipolar mechanism is turned off.

As the gate 59 shifts low, the NMOS 56 is turned off. Under the charge of PMOS 55, the voltage of base 54 increases and the bipolar is turned off completely.

In the collector region, the conducting well is made of the N++ region 531, P+ region 532 and the tunneling junction 533. In the base region 54, the conducting well is made of the P+ region 541, N++ region 542 and the ohmic tunneling junction 543.

Figure 5C:
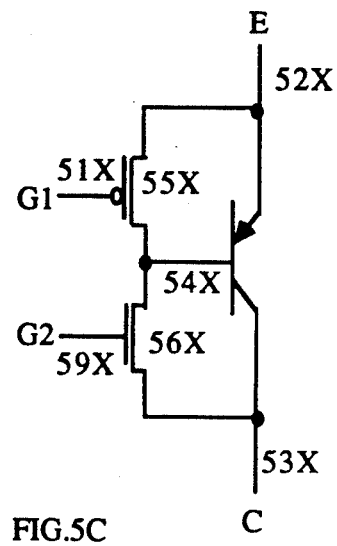

FIG. 5B is the schematic of the PN-PNP BiMOS device. FIG. 5C is the equivalent circuit.

Figure 6B:
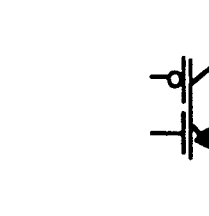
FIG. 6 (A) is the cross section for the PN-NPN BiMOS device; (B) is the symbol for the PN-NPN BiMOS circuit; (C) is the equivalent circuit for the PN-NPN BiMOS circuit.
Figure 6A:
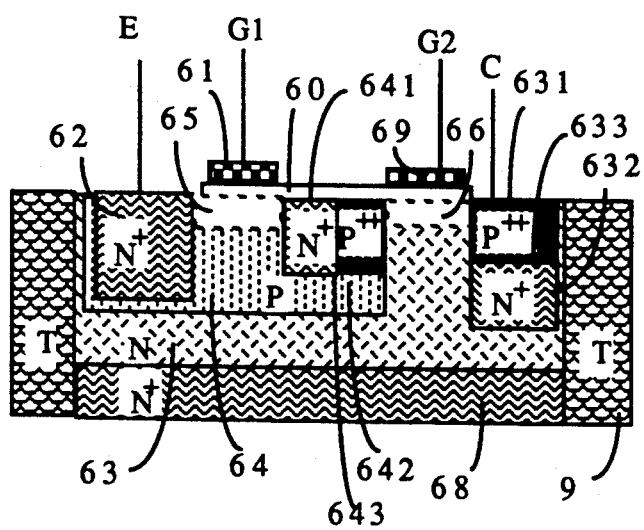

Referring to FIG. 6A, assuming gates 61 and 69 are high and the bipolar NPN is turned off. As the gates 61 and 69 switch low, the voltage of base 64 is pulled high and the base current flows into the base 64. The bipolar is turned on and a lot of collector current discharges the load of collector 63. The voltages of collector 63 and base 64 decrease. As the voltage of base 64 is within the voltage increment of one forward bias diode from the voltage of emitter 62, the bipolar mechanism is turned off.

As the gates 61 and 69 switch high, the PMOS turns off. Under the discharge of NMOS 65, the voltage of base 64 decreases and the NPN bipolar is turned off.

In the collector region, the conducting well is made of the P++ region 631, N+ region 632 and the tunneling junction 633. In the base region 64, the conducting well is made of the N+ region 641, P++ region 642 and the ohmic tunneling junction 643.

Figure 6C:
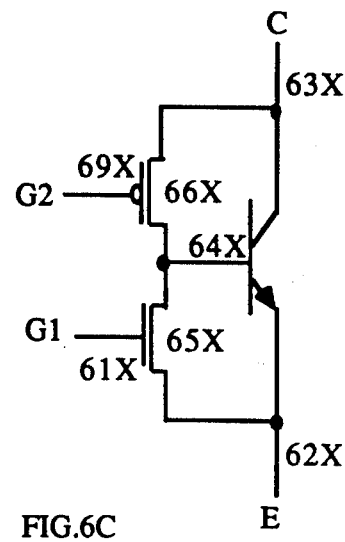

FIG. 6B is the symbol of the PN-NPN BiMOS device. FIG. 6C is the equivalent circuit of the PN-NPN BiMOS device.

As shown in FIG. 7, it is the NP-PNP BiMOS device. In the base region 74, the conducting well is made of the N+ region 742, P++ region 741 and the tunneling junction 743. In the P+ emitter 72, the conducting well is made of N++ region 721 and ohmic tunnel junction 723. As shown in FIG. 8, it is the NP-NPN BiMOS device. The conducting well is made of the N+ region 842, P++ region 841 and the tunneling junction 843. The discussions of the operations of NP-PNP and NP-NPN BiMOS devices are similar to the PN-PNP and PN-NPN BiMOS devices.

Figure 9A:
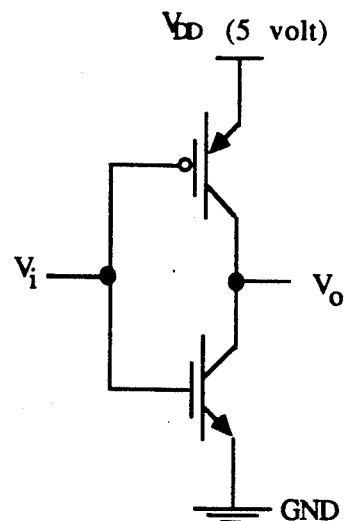
FIG. 9 (A) is the inverter made of the P-PNP and N-NPN BiMOS devices; (B) is the cross-section of the common tub structure for the BiMOS inverter as shown in FIG. 9A; (C) is the alternative common tub structure for the BiMOS inverter as shown in FIG. 9A.
Figure 9B:
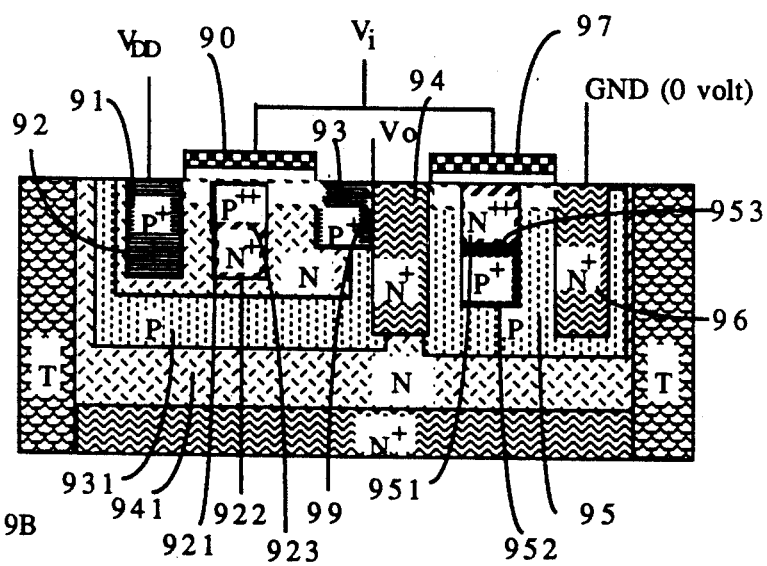
Figure 9C:
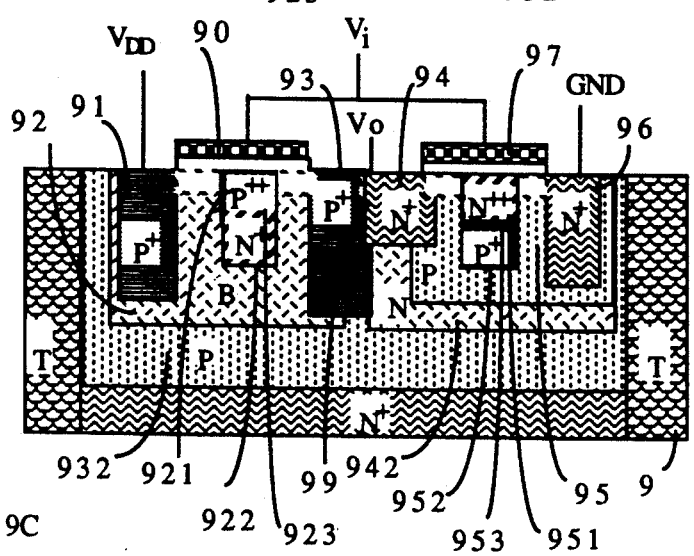
Figure 10A:
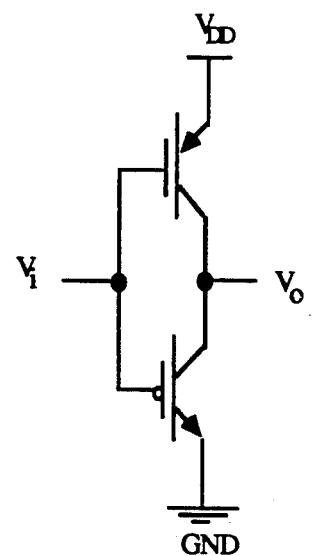
FIG. 10 (A) is the digital buffer made of the BiMOS devices; (B) is the crossection of the common tub structure for the BiMOS buffer as shown in FIG. 10A; (C) is the alternative common tub structure for the BiMOS buffer as shown in FIG. 10A.

To show the novelty of my BiMOS devices, FIGS. 9 and FIG. 10 are the examples of circuits designed with BiMOS devices. FIG. 9 shows it is easy to modify the existing CMOS circuit to be the BiMOS circuit. FIG. 10 shows the novel BiMOS circuit design which CMOS or bipolar circuits cannot duplicate. Using the BiMOS devices, the number of devices is reduced and the performance of circuit is improved.

FIG. 9 is the BiMOS inverter made of N-NPN and P-PNP complimentary BiMOS devices. FIG. 9A is the schematics of the BiMOS inverter. The circuit configuration is similar to the CMOS inverter: the PMOS is substituted with P-PNP BiMOS and NMOS is substituted with N-NPN BiMOS. As Vi is high, P-PNP is off and N-NPN is on, Vo is low. As Vi is low, P-PNP is on and N-NPN is off, Vo is high. It has the rack-to-rack full-swing of voltage range.

FIG. 9B and FIG. 9C are two different common tub device structures for the BiMOS inverter as shown in FIG. 9A. In FIG. 9B, the collector region 941 envelops the collector region 931. In FIG. 9C, the collector region 932 envelops the collector region 942. The P-PNP BiMOS is constituted of the gate 90, emitter, base 92 and collector 93. The N-NPN BiMOS is constituted of the collector 94, base 95 and emitter 96. The tunneling junction 99 connects the collector 93 of P-PNP BiMOS with the collector 94 of N-NPN BiMOS.

In the BiMOS SRAM memory design, the latch of the memory cell comprises two BiMOS inverters. The BiMOS inverter has the advantages of compact area, minimum power consumption, minimum heat dissipation, fast access time and superior driving capability. These superiorities make the ultra large size memory available.

FIG. 10 is the digital buffer made of N-PNP and P-NPN complimentary BiMOS device. It shows the BiMOS circuit has the novel designs that the CMOS circuit doesn't have. The BiMOS digital buffer is a single stage circuit. There is no such a single stage CMOS buffer. This circuit cannot be duplicated with CMOS technology.

Figure 10B:
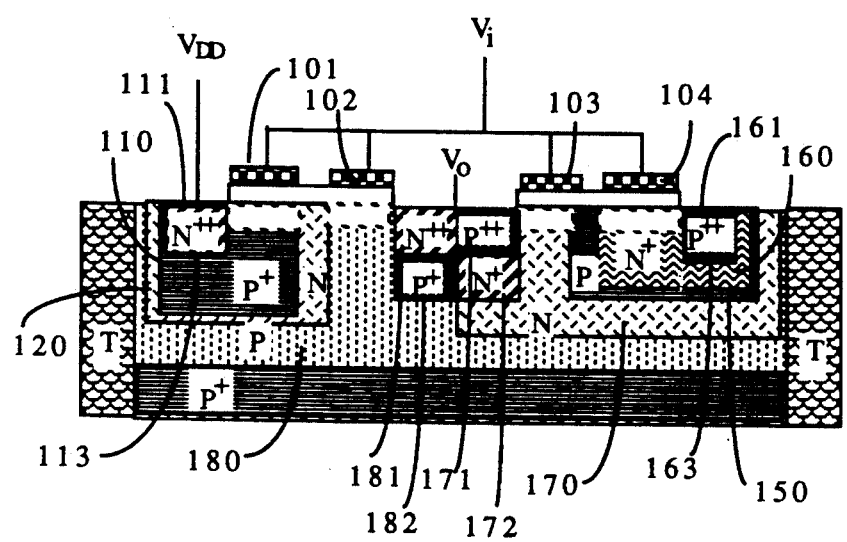
Figure 10C:
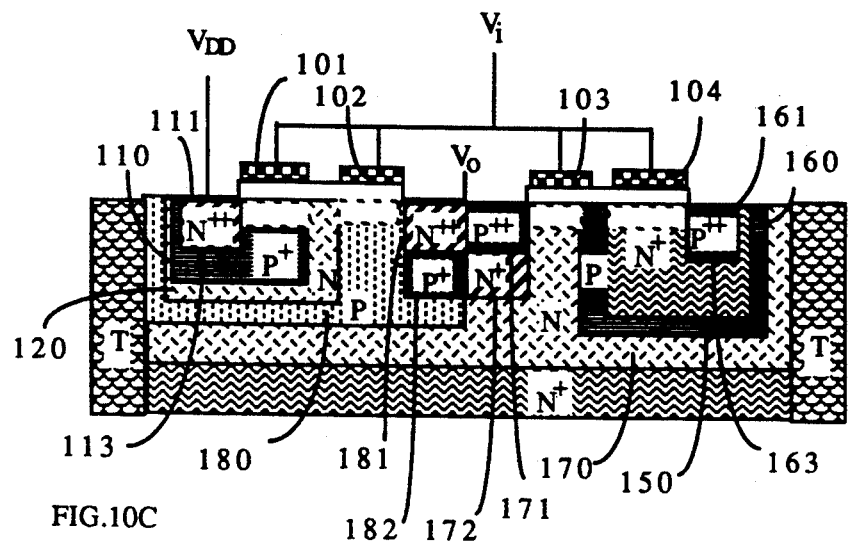

FIG. 10B and FIG. 10C are two different common tub structures for the digital buffer made of complementary BiMOS. In FIG. 10B, the collector region 180 envelops the collector region 170. In FIG. 10C, the collector region 170 envelops the collector region 180. The N-PNP BiMOS is constituted of the gates 101 and 102, emitter 110, base 120 and collector 130. The P-NPN BiMOS is constituted of the collector 180, base 150 and emitter 160. The conduct well is constituted of the N++ region 181, P+ region 182, P++ region 171 and N+ region 172. The conduct well connects the collector 180 of N-PNP BiMOS with the collector 170 of P-NPN BiMOS. As Vi is high, N-PNP is on and P-NPN is off; Vo is high. As Vi is low, N-PNP is off and P-NPN is on; Vo is low. It has the rack-to-rack full-swing of voltage range.

Figure 11A:
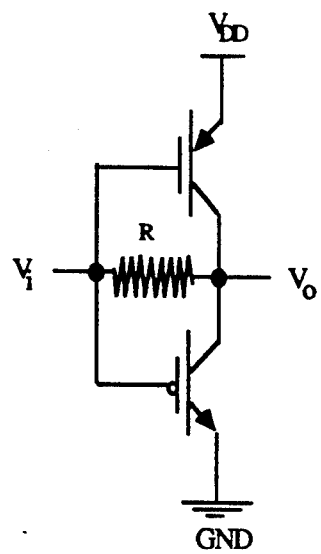
FIG. 11 (A) is the BiMOS SRAM made of the BiMOS digital buffer; (B) is the cross section of the common tub structure for the BiMOS SRAM as shown in FIG. 11A; (C) is the alternative common tub structure for the BiMOS SRAM as shown in FIG. 11A.
Figure 11B:
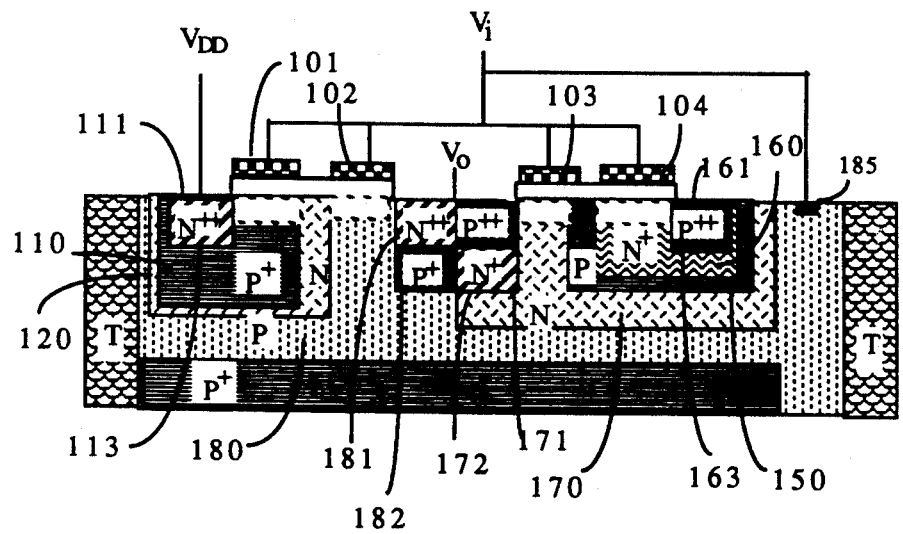
Figure 11C:
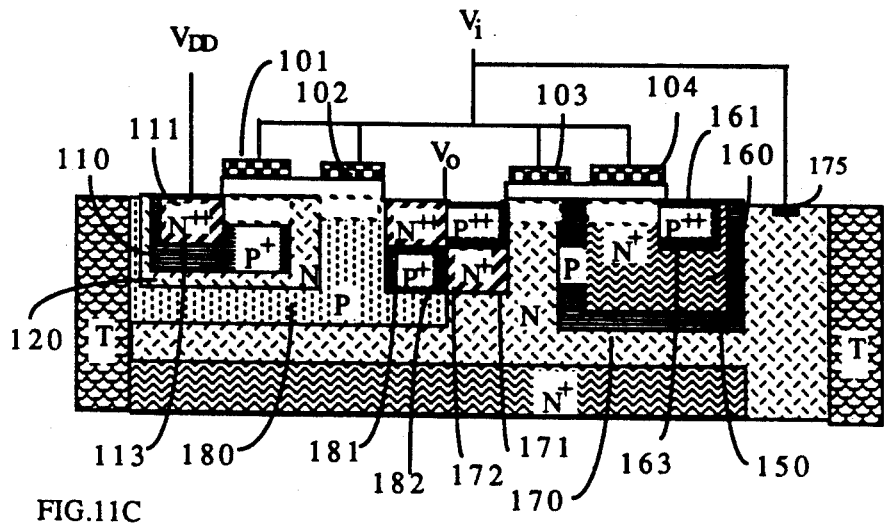

Furthermore, the BiMOS SRAM can be made of the BiMOS deigital buffer. As shown in FIG. 11, connecting Vi to Vo with a high impedance R or a switch, this BiMOS digital buffer constitutes the latch of SRAM cell. The high impedance may be integrated in the same single cell. Making a contact 185 to the collector region 180 as shown in FIG. 11B or making a contact 175 to the collector region 170 as shown in FIG. 11C, the high impedance is formed.

The BiMOS EPROM and BiMOS EEPROM are the high speed nonvolatile memory device. Almost all the techniques developed for MOS EPROM and MOS EEPROM may be applied to the BiMOS device to generate the novel BiMOS EPROM and BiMOS EEPROM memory. Similar to the MOS EPROM and MOS EEPROM, with the addition of floating gate and/or controlled gate and/or side gate to the BiMOS device such as N-NPN BiMOS EEPROM in FIG. 12A and P-PNP BiMOS EEPROM in FIG. 13A, the BiMOS EPROM and BiMOS EEPROM may be generated.

Figure 12A:
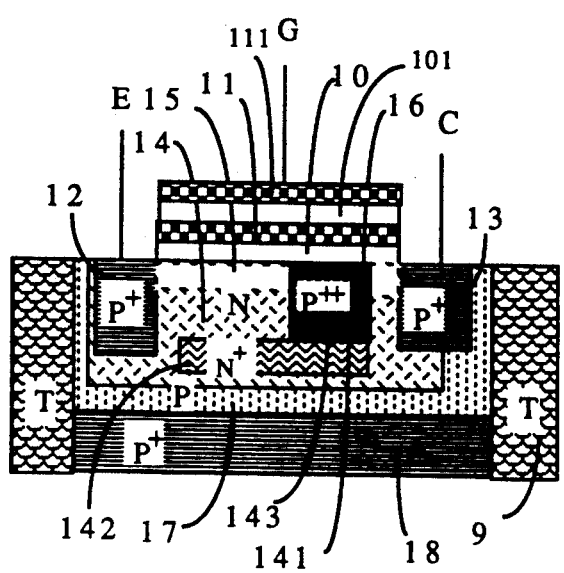
FIG. 12 (A) is the cross section of the P-PNP BiMOS EEPROM memory device; (B) is the symbol for the P-PNP BiMOS EEPROM memory device; (C) is the equivalent circuit for the P-PNP BiMOS EEPROM memory circuit.
Figure 12B:
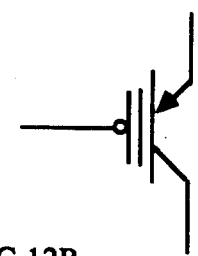
Figure 12C:
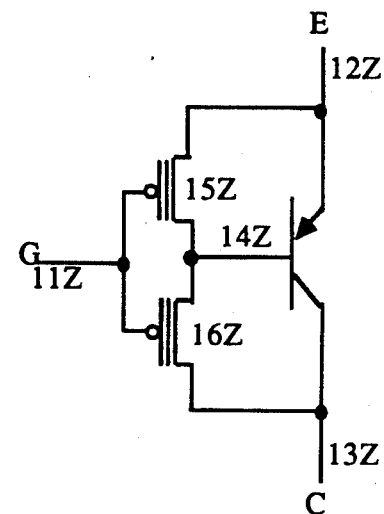

In FIG. 12A, the control gate 111 overlaps on the floating gate 11. FIG. 12B is the symbol of the P-PNP BiMOS EEPROM. FIG. 12C is the equivalent circuit for the P-PNP BiMOS EEPROM. The control gate 111 controls the charging and discharging process of the stored charge in the floating gate 11. As the stored charge in the floating gate is in 0 state, the P-PNP BiMOS EEPROM is conductive. As the stored charge in the floating gate is in 1 state, the P-PNP BiMOS EEPROM is turned off.

Figure 13A:
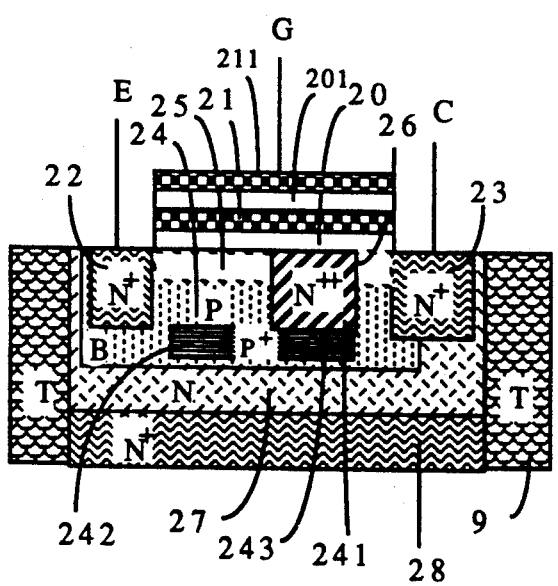
FIG. 13 (A) is the cross section for the N-NPN BiMOS EEPROM memory device; (B) is the symbol for the N-NPN BiMOS EEPROM memory circuit; (C) is the equivalent circuit for the N-NPN type BiMOS EEPROM memory circuit.
Figure 13B:
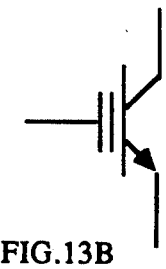
Figure 13C:
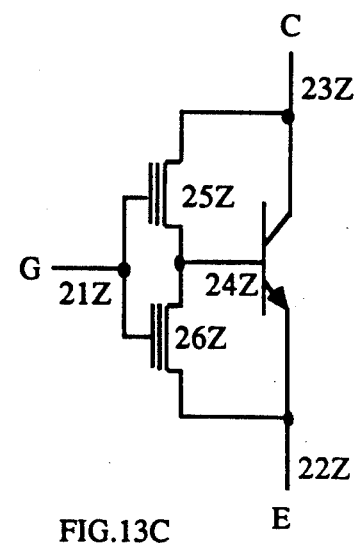

In FIG. 13A, the control gate 211 overlaps on the floating gate 21. FIG. 13B is the symbol of the P-PNP BiMOS EEPROM. FIG. 13C is the equivalent circuit for the N-NPN BiMOS EEPROM. The control gate 211 controls the charging and discharging process of the stored charge in the floating gate 21. As the stored charge in the floating gate is in 1 state, the P-PNP BiMOS EEPROM is conductive. As the stored charge in the floating gate is in 0 state, the P-PNP BiMOS EEPROM is turned off.

Figure 14:
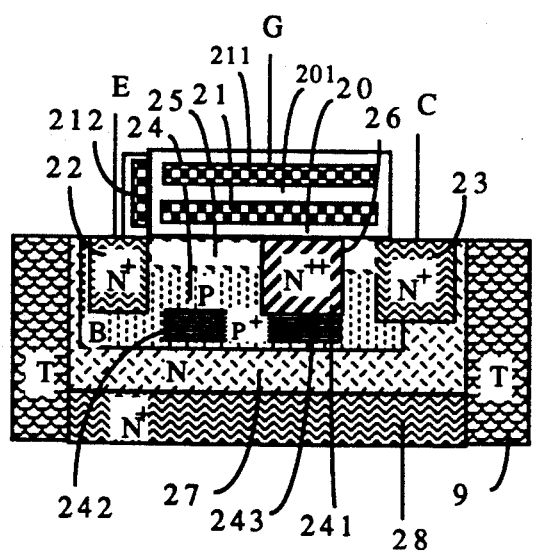
FIG. 14 is the cross section for the EEPROM memory device having the side gate.
Figure 15:
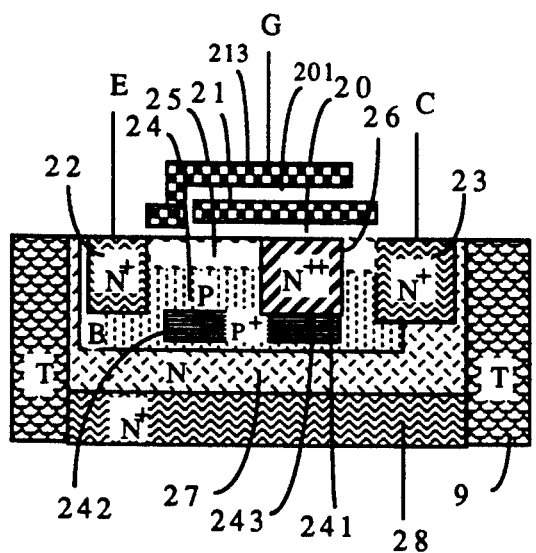
FIG. 15 is the cross section for the EEPROM memory device having the control gate with side gate effect.
Figure 16:
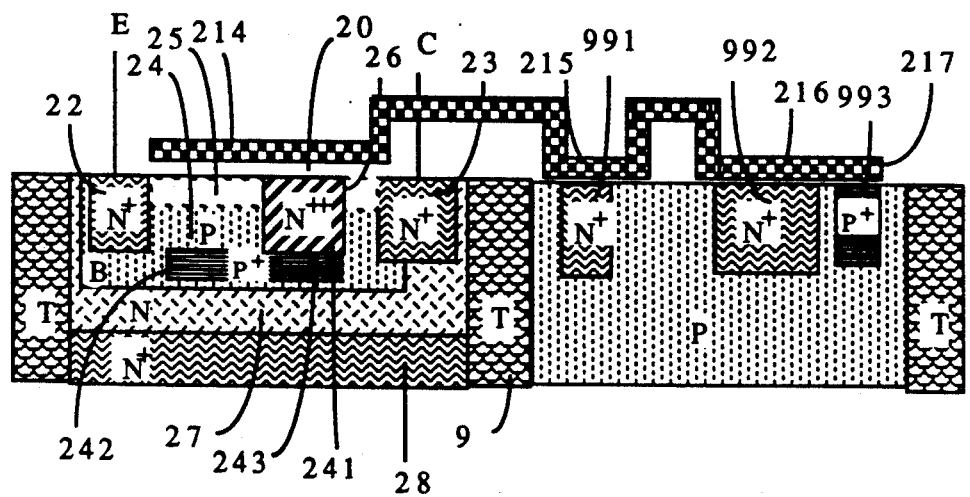
FIG. 16 is the cross section for the EEPROM memory device having the single gate.

FIG. 14, FIG. 15 and FIG. 16 illustrate my BiMOS devices applying to the other different EEPROM technologies. FIG. 14 is the low voltage source side injection EEPROM. The side gate 212 is a floating polysilicon spacer. FIG. 15 is the alternative design of EEPROM employing source side injection. The control gate 213 in FIG. 15 is the merge of side gate 212 and the control gate 211 in FIG. 14. A weak gate control region is provided in the device near the source so that a relatively high channel electrical field for promoting hot-electron injection is created under the weak gate control region when the device is biased for programming. FIG. 16 shows the single gate EEPROM. The reading and writing electrodes may be integral with the source and drain regions of the reading field effect transistor. During writing, the programming voltage is momentarily applied to the writing electrode 992 via the larger capacitance. During erasing, the programming voltage is momentarily applied to the writing electrode 991 via the smaller capacitance. The insulated-gate portions 215 and 217 over the erasing electrode 215 or the diffusion region 217 are to be dimensioned so thin as to enable the junction crossing of hot carriers. The insulated-gate portion 216 over the writing electrode is preferably to be given the same thickness.

In summary for the conducting well technologies, the conducting wells are generated with the double diffusion process or the implantation and diffusion processes. The double diffusion process is to have the conducting well to be diffused with the highly doped N+ and P++ diffusion or P+ and N++ diffusion successively. Since both the P region and N diffusion are heavily doped, the junction as their interface is essentially a tunnel junction across which conduction readily occurs by means of a tunneling mechanism as is well known in the art. The connection is, therefore, essentially ohmic. FIG. 17 and FIG. 18 show the different conducting wells adopted in this invention.

Figure 17A:
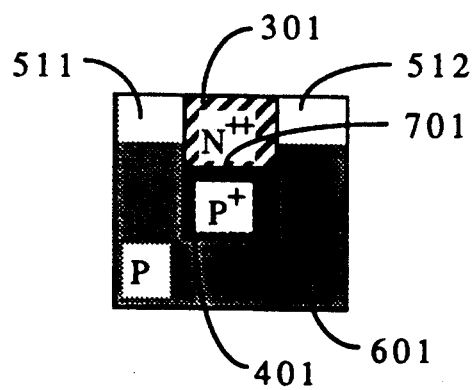
FIG. 17 is the conducting wells made of the double diffusion having the tunneling effect; (A) is the conducting well made of the double diffusion in the P well; (B)

FIG. 17A is the conducting well made of N++ diffusion 301 and P+ diffusion 401 and the tunneling junction 701 in the lowly doped P substrate 601. The conducting well connection connecting the channel 511, channel 512 to substrate 601 is essentially ohmic. The N++ diffusion 301 is the source or drain of channels 511 and 512. The conducting well serves as the intercessor among the substrate 601, channels 511 and 512.

Figure 17B:
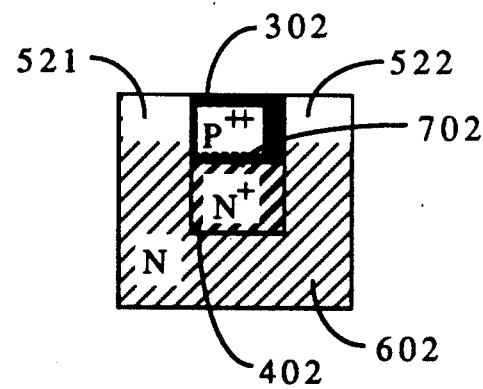

FIG. 17B is the conducting well made of P++ diffusion 302 and N+ diffusion 402 and the tunneling junction 702 in the lowly doped N substrate 602. The conducting well connecting the channel 521, channel 522 to substrate 602 is essentially ohmic. The P++ diffusion 302 is the source or drain of channels 521 and 522. The conducting well serves as the intercessor among the substrate 602, channels 521 and 522.

Figure 18A:
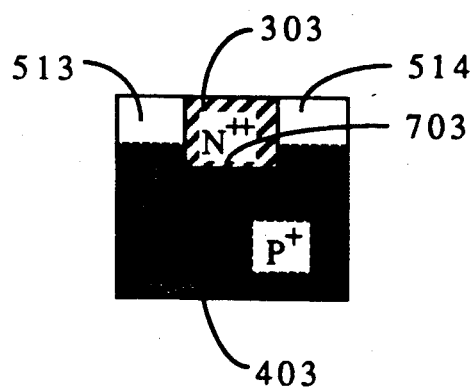

FIG. 18A is the conducting well made of N++ diffusion 303 and the tunneling junction 703 in the P+ diffusion 403. The conducting well connection connecting the channel 513, channel 514 to P+ tub 403 is essentially ohmic. The N++ diffusion 303 is the source or drain of channels 513 and 514. The conducting well serves as the intercessor among the P+ tub 403, channels 513 and 514.

Figure 18B:
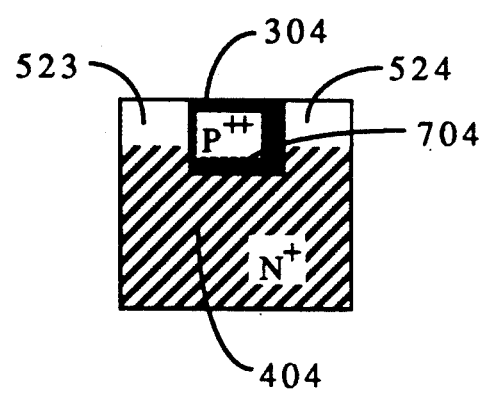

FIG. 18B is the conducting well made of P++ diffusion 304, N+ diffusion 404 and the tunneling junction 704. The conducting well connecting the channel 523, channel 524 to N+ tub 404 is essentially ohmic. The P++ diffusion 304 is the source or drain of channels 523 and 524. The conducting well serves as the intercessor among the N+ tub 404, channels 523 and 524.

FIG. 19 is the conducting well made of P++ diffusion 703 in the lightly doped P substrate 603, N++ diffusion 704 in the lightly doped N substrate 604 and the tunneling junction 705. The conducting well connection connecting the P channel 551, N channel 552 to P substrate 603 and N substrate 604 is essentially ohmic. The N++ diffusion 704 and P++ diffusion 703 are the source or drain of channels 551 and 552. The conducting well serves as the intercessor among the P substrate 603, N substrate 604, channels 551 and 552.

FIG. 20 is the conducting well made of P+ diffusion 407 and N++ diffusion 307 in the lightly doped P substrate 607, N+ diffusion 408 and P++ diffusion 308 in the lightly doped N substrate 608 and the tunneling junctions 706, 707 and 708. The conducting well connection connecting the P channel 562, N channel 561 to P substrate 607 and N substrate 608 is essentially ohmic. The N++ diffusion 307 and P++ diffusion 308 are the source or drain of channels 561 and 562. The conducting well serves as the intercessor among the P substrate 607, N substrate 608, channels 561 and 562.

In FIG. 1A, the conducting well made of regions 141 and 142 is the conducting well as shown in FIG. 17B. In FIG. 2A, the conducting well made of regions 241 and 242 is the conducting well as shown in FIG. 17A. In FIG. 3A, the conducting well in the collector region made of regions 331 and 332 is the conducting well as shown in FIG. 17A; the conducting well in the emitter region made of N++ region 321 and the ohmic tunneling junction 323 is the conducting well as shown in FIG. 18A. In FIG. 4A, the conducting well made of regions 431 and 432 is the conducting well as shown in FIG. 17B; the conducting well in the emitter region made of P++ region 421 and the ohmic tunneling junction 423 is the conducting well as shown in FIG. 18B. In FIG. 5A, in the collector region, the conducting well made of regions 531 and 532 is the conducting well as shown in FIG. 17A; in the base region, the conducting well made of regions 541 and 542 is the conducting well as shown in FIG. 17B. In FIG. 6A, in the collector region, the conducting well made of regions 631 and 632 is the conducting well as shown in FIG. 17B; in the base region, the conducting well made of regions 641 and 642 is the conducting well as shown in FIG. 17A. In FIG. 7A, in the base region, the conducting well is the conducting well as shown in FIG. 17B; in the emitter region, the conducting well is the conducting well as shown in FIG. 18A. In FIG. 8A, in the base region, the conducting well made of regions 841 and 842 is the conducting well as shown in FIG. 17A; in the emitter region, the conducting well is the conducting well as shown in FIG. 18B. In FIG. 9B and FIG. 9C, the conducting well made of regions 951 and 952 is the conducting well as shown in FIG. 17A; the conducting well made of regions 921 and 922 is the conducting well as shown in FIG. 17B. The tunneling junction 99, the P+ collector 93 and N+ collector 94 constitute the conducting well as shown in FIG. 18. The tunneling junction 99 of the conducting well is vertical. In FIG. 10B and FIG. 10C, the conducting well made of the diffusion regions 171,172, 181, and 182 is the conducting well as shown in FIG. 19.

In the above discussions, the BiMOS devices, memories and circuits are illustrated. While the invention has been particularly shown and described with reference to the preferred embodiments thereof, it will be understood by those skilled in the art that various changes in form and detail may be made therein without departing from the spirit and scope of the invention.

I claim:

1. A unitary bipolar/MOSFET transistor structure, comprising:
   a first semiconductor region of first conductivity type, said first semiconductor region having a major surface;
   second, third, and fourth regions of second conductivity type in said first region, said second, third, and fourth regions each adjoining said major surface, said third region being spaced from said second region by a first channel portion of said first region, said fourth region being spaced from said third region by a second channel portion of said first region, and said second and fourth regions being spaced apart from each other,
   a gate electrode insulatingly overlying both said first and said second channel portions,
   a substrate region of second conductivity type, said substrate region underlying said first semiconductor region and being spaced from said second region by a portion of said first region, so that said second region, said portion of said first region, and said substrate region form a bipolar transistor structure, said fourth region adjoining said substrate region so as to form a connection thereto;
   means for forming a low impedance connection between said third region and said first region;
   an emitter electrode connected to said second region and a collector electrode connected to said fourth region;
   whereby said structure forms an equivalent circuit comprising a bipolar transistor having said emitter and collector electrode as its respective main terminal, and with said first region as its base region, with a first effective insulated gate field effect transistor connected between said emitter electrode and said first region, and a second insulated gate field effect transistor connected between said first region and said collector electrode, said gate electrode controlling conduction of both field effect transistors, so that when an input voltage is applied between said gate electrode and one of said emitter and collector electrodes so as to render said first field effect transistor and said second field effect transistor conductive, said first and second insulated gate field effect transistors act as a voltage divider between said emitter and collector electrodes and provide a voltage to said first region with respect to said second region to cause said bipolar transistor to conduct.

2. A unitary bipolar/MOSFET transistor structure according to claim 1, wherein said first semiconductor region is of N-type conductivity and said second, third, fourth regions and said substrate region are of P-type conductivity, said means for forming a low impedance connection between said third region and said first region being an P+/N+ tunneling junction.

3. A unitary bipolar/MOSFET transistor structure according to claim 1, wherein said first semiconductor region is of P-type conductivity and said second, third, fourth regions and said substrate region are of N-type conductivity, said means for forming a low impedance connection between said third region and said first region being an N+/P+ tunneling junction.

4. A unitary bipolar/MOSFET transistor structure, comprising:
   a first semiconductor region of first conductivity type, said first semiconductor region having a major surface;
   a second semiconductor region of second conductivity type in said first region, adjoining said major surface;
   a third semiconductor region of first conductivity type in said second region, being spaced from said first region by said second region, said third region also adjoining said major surface;

a fourth region of second conductivity type in said third region, adjoining said major surface and being spaced from said second region by said third region;

a fifth region of second conductivity type in said first region, adjoining said major surface and being spaced from said second region by a first channel portion of said first region;

said second region being spaced from said fourth region by a second channel portion of said third region;

a first gate electrode insulatingly overlying said first channel portion of the third region, a second gate electrode insulatingly overlying said second channel portion of the first region and being coupled to said first gate electrode, said first region, said second region and said third region forming a bipolar transistor structure, means for forming a low impedance connection between said first region and said fifth region;

means for forming a low impedance connection between said fourth region and said third region;

an emitter electrode connected to said fourth region and a collector electrode connected to said fifth region;

whereby said structure forms an equivalent circuit comprising a bipolar transistor having said emitter and collector electrodes as its respective main terminals, and with said second region as its base region, with a first effective insulated gate field effect transistor connected between said emitter electrode and said second region, and a second insulated gate field effect transistor connected between said second region and said collector electrode, said first and second gate electrodes controlling conduction of both field effect transistors, so that when an input voltage is applied between said gate electrode and one of said emitter and collector electrodes so as to render said first field effect transistor and said second field effect transistor conductive, said first and second insulated gate field effect transistors act as a voltage divider between said emitter and collector electrodes and provide a voltage to said second region with respect to said third region to cause said bipolar transistor to conduct.

5. A unitary bipolar/MOSFET transistor structure according to claim 4, wherein said first region and third region are of P-type conductivity and said second, fourth and fifth regions are of N-type conductivity, said means for forming a low impedance connection between said fifth and first regions being an N+/P+ tunneling junction.

6. A unitary bipolar/MOSFET transistor structure according to claim 4, wherein said first region and third region are of N-type conductivity and said second, fourth and fifth regions are of P-type conductivity, said means for forming a low impedance connection between said fifth and first regions being a P+/N+ tunneling junction.

7. A unitary bipolar/MOSFET transistor structure, comprising:

a first semiconductor region of first conductivity type, said first semiconductor region having a major surface;

a second semiconductor region of second conductivity type in said first region, adjoining said major surface;

third and fourth semiconductor regions of first conductivity type in said second region, said third and fourth regions each adjoining said major surface, said third region being spaced from said fourth region by a channel portion of said second region;

a fifth region of second conductivity type in said second region, adjoining said major surface;

means for forming a low impedance connection between said fifth region and said fourth region;

a sixth region of second conductivity type in said first region, adjoining said major surface and being spaced from said fifth region by a channel portion of said first region;

means for forming a low impedance connection between said sixth region and said first region;

a first gate electrode insulatingly overlying the channel portion of said second region;

a second gate electrode insulatingly overlying the channel portion of said first semiconductor region;

said first region having a portion underlying said second region and spaced from said third region by a portion of said second region, said third region, said portion of second region and said portion of said first region forming a bipolar transistor structure;

an emitter electrode connected to said third region and a collector electrode connected to said sixth region;

whereby said structure forms an equivalent circuit comprising a bipolar transistor having said emitter and collector electrodes as its respective main terminals, and with said second region as its base region, with a first effective insulated gate field effect transistor connected between said emitter electrode and said fourth region, and a second insulated gate field effect transistor connected between said fifth region and said collector electrode, said first gate electrode controlling conduction of said first field effect transistor, said second gate electrode controlling conduction of said second field effect transistor.

8. A unitary bipolar/MOSFET transistor structure according to claim 7, wherein said first, third and fourth regions are of P-type conductivity and said second, fifth and sixth regions are of N-type conductivity, said means for forming a low impedance connection between said sixth and first regions being a N+/P+ tunneling junction.

9. A unitary bipolar/MOSFET transistor structure according to claim 7, wherein said first, third and fourth regions are of N-type conductivity and said second, fifth and sixth regions are of P-type conductivity, said means for forming a low impedance connection between said sixth and first regions being a P+/N+ tunneling junction.

10. A unitary bipolar/MOSFET transistor structure, comprising:

a first semiconductor region of first conductivity type, said first semiconductor region having a major surface;

a second semiconductor region of second conductivity type in said first region, adjoining said major surface;

a third semiconductor region of first conductivity type in said second region, being spaced from said first region by said second region, said third region also adjoining said major surface;

a fourth region of second conductivity type in said third region, adjoining said major surface and being spaced from said second region by said third region;

means for forming a low impedance connection between said third region and said fourth region;

a fifth region of first conductivity type in said second region, adjoining said major surface and being spaced from said third region by said second region;

a sixth region of first conductivity type overlapping said first region and said second region along said major surface, said sixth region being spaced from said fifth region by a channel portion of said second region;

said second region being spaced from said fourth region by a channel portion of said third region;

means for forming a low impedance connection between said fifth region and said second region;

a first gate electrode insulatingly overlying the channel portion of said third region;

a second gate electrode insulatingly overlying the channel portion of said second region;

a portion of said first region underlying said third region and being spaced from said third region by a portion of said second region, so that said third region, said portion of said second region and said portion of said first region form a bipolar transistor structure;

an emitter electrode connected to said fourth region and a collector electrode connected to said sixth region;

whereby said structure forms an equivalent circuit comprising a bipolar transistor having said emitter and collector electrode as its respective main terminal, and with said second region as its base region, with a first effective insulated gate field effect transistor connected between said emitter electrode and said second region, and a second insulated gate field effect transistor connected between said fifth region and said collector electrode, said first gate electrode controlling conduction of said first field effect transistor, said second gate electrode controlling conduction of said second field effect transistor.

11. A unitary bipolar/MOSFET transistor structure according to claim 10, wherein said first, third, fifth and sixth regions are of P-type conductivity, said second and fourth regions are of N-type conductivity, said means for forming a low impedance connection between said fifth and second regions being a P+/N+ tunneling junction.

12. A unitary bipolar/MOSFET transistor structure according to claim 10, wherein said first, third, fifth and sixth regions are of N-type conductivity, said second and fourth regions are of P-type conductivity, said means for forming a low impedance connection between said fifth and second regions being a N+/P+ tunneling junction.

13. A semiconductor device according to claim 1, wherein said device further comprises a floating gate underlying said first gate electrode and said second gate electrode and insulated from said collector, emitter, base and said first and second channels.

* * * * *